(12) United States Patent
Shun'ko

(10) Patent No.: US 7,514,875 B2
(45) Date of Patent: Apr. 7, 2009

(54) RF PLASMA SOURCE WITH QUASI-CLOSED FERRITE CORE

(76) Inventor: Evgeny V. Shun'ko, 7584 Abigail Dr., Superior Township, MI (US) 49198

( * ) Notice: Subject to any disclaimer, the term of this patent is extended or adjusted under 35 U.S.C. 154(b) by 307 days.

(21) Appl. No.: 11/607,603

(22) Filed: Dec. 1, 2006

(65) Prior Publication Data

US 2008/0088242 A1    Apr. 17, 2008

(51) Int. Cl.
*H01J 7/24*    (2006.01)
(52) U.S. Cl. ............................ 315/111.21; 315/111.51; 315/111.71
(58) Field of Classification Search ............ 315/111.21, 315/111.31, 111.41, 111.51, 111.71
See application file for complete search history.

(56) References Cited

U.S. PATENT DOCUMENTS 5,464,476 A * 11/1995 Gibb et al. ............ 118/723 MP
5,619,103 A *  4/1997 Tobin et al. ............ 315/111.21

* cited by examiner

*Primary Examiner*—David Hung Vu
(74) *Attorney, Agent, or Firm*—Carothers & Carothers

(57) ABSTRACT

An inductively coupling plasma source having a primary winding powered directly from a radio frequency source and a quasi-closed O-type ferrite core comprised of two equal U-shaped core halves separated from one another to form two operating gaps between aligned spaced ends of the core halves with the quasi-closed ferrite core disposed in the primary winding. A metallic housing is provided having a discharge chamber therein and two opposed walls with symmetrically opposed bone-shaped ports, wherein the ports are closed and vacuum sealed with insulating material and each is provided with two side openings dimensionally respectively fitted to and engaged with the spaced ends of the quasi-closed ferrite core, and a through slot connecting the side openings along their centerline for inductive excitation and maintenance of plasma in the operating gaps positioned within the discharged chamber.

5 Claims, 7 Drawing Sheets

RF PLASMA SOURCE WITH QUASI-CLOSED FERRITE CORE

FIELD OF INVENTION

The present invention relates to RF (radio frequency) plasma sources applicable to plasma processing technologies. More specifically, the present invention relates to plasma sources utilizing an O-type closed ferrite core cut across to provide two equal U-shaped disconnected halves to form two operating gaps (hereinafter referred a quasi-closed ferrite core). The quasi-closed ferrite core is mounted at room atmosphere within a discharge chamber of a metallic housing disposed in the operating gaps. The discharge chamber is equipped with special small vacuum-sealed ports of an insulator capable to permit a core induced alternating magnetic flux to pass in this manner throughout the chamber. The quasi-closed ferrite core has an actual primary winding supplied by RF power of 0.1-1 MHz, and a virtual secondary closed winding is formed by the electrons of gas-discharge plasma in the discharge chamber filled with a gas of a controllable pressure. The range of operating gas pressures is 1 mTorr to atmospheric pressure. The range of the active power contributed to plasma can be from a hundred watts to an unlimited value. The range of plasma density developed in the chamber is about $10^{11}$-$10^{14}$ cm$^{-3}$. The range of the device size is from a few centimeters to a physically unlimited area.

BACKGROUND OF THE INVENTION

RF inductively coupled plasma (ICP) sources are widely applied in plasma processing technologies for manufacturing of semiconductor chips (etching, deposition, ion implantation, sputtering, pure silicon production), in the large panel display industry, micro-machine production, nanotechnology, and as the basis for ion sources [see Industrial Plasma Engineering", v. 1, by J. Reece Roth, ", pp. 391-413 (IOP Publishing Ltd, 1995)]. These types of sources are popular because of their ability to maintain high density plasmas at a relatively low operating gas pressure.

For a typical ICP source with an inductor coil wound on the surface of a vacuum-sealed port of an insulator, and driven at 13.56 MHz, at the active RF power consumed in plasma of about 1 kW, the inner volume of the discharge chamber is a few liters, and the operating gas pressure is in the range 1-100 mTorr, the resonant RF current of the coil is a few tenth of amperes, and the RF voltage across the coil is a few kV [see for example FIG. 11.16 in the publication "Industrial Plasma Engineering", v. 1, by J. Reece Roth, p. 413 (IOP Publishing Ltd. 1995)]. The RF power loss at these conditions in the matcher, connectors, and at the inductor coil is about the same as consumed in plasma. Besides that, proximity of the coil and metallic walls of the discharge chamber leads to an additional power loss in these walls due to inductive heating caused by eddy currents. The high value of the RF voltage (few kV) applied across the inductor coil causes flow of a considerable capacitive current through the coil, dielectric, and plasma to the chamber walls. This physical process builds a high negative dc potential on the surface of the insulator facing the plasma thereby accelerating the plasma ions toward this surface and causing surface erosion, plasma contamination, and an increase of plasma dc potential reference with respect to the chamber, all at the same time.

To overcome the considered problems, the ferrite core 1 with an actual primary winding 2 can be set within the discharge chamber 3 as is shown in FIG. 1, illustrating the Prior Art [see E. Shun'ko, U.S. Pat. No. 5,998,933], to induce around the core an alternating vertex electrical field E capable of accelerating the electrons and exciting and maintaining plasma within the discharge chamber 3. However setting the bare ferrite core with the primary winding directly in the discharge chamber is not desirable for technologies requiring a high purity in the process. Taking into account that the drop in potential experimentally measured on the closed loop around the core is about 100 V, assumes that the coil of the primary winding, comprising a minimum possible 1 turn, should also have about a 100 V drop, one can conclude that a considerable density of the ions accelerated to the energy level of about 100 eV can be expected in the plasma and will bombard the coil and the core causing plasma contamination and possible damage to the substrate. Setting the bare ferrite core with the coil in the discharge chamber also creates a problem with the core and coil cooling necessary for long lasting proper operation of the inductor at a certain power value. To avoid this problem, one can envelope the core and the coil in a dielectric or in a cooled metallic jacket having an electrical gap around the core, to prevent an electrical shortage, and vacuum sealed to provide the coolant (air) circulation [see U.S. Pat. No. 5,998,933 by E. Shun'ko; US Pub. No. 2003/0015965 A1V by V. Godyak]. However the design and the practical realization of these jackets meet a plurality of the obvious and latent engineering problems due to relative complicacy of these embodiments There is the possibility of avoiding the considered problems by building an external bridge connecting one part of the discharge chamber with another one by a bent metallic tube with a short insulating pipe inserted (to avoid shortage in the discharge counter) and passing throughout the circular ferrite core(s) having the primary winding(s) [see U.S. Pat. No. 6,392,351 B1 by E. Shun'ko,]. However about half of the plasma volume generated by this type of plasma inductor is wrapped within the tube of the same external bridge, and the energy of this part of the plasma is dispersed in the tube walls providing useless and undesirable heating.

The present invention enables one to overcome all the problems considered above by insertion of a discharge chamber equipped with corresponding small bone-shaped ports of an insulator in gap(s) of the quasi-closed high permeability (ferrite) core disposed in a coil of a primary winding.

OBJECT OF THE INVENTION

It is an object of the present invention to provide a plasma source formed in a metallic discharge chamber equipped with bone-shaped vacuum-sealed ports of an insulator and inserted into gaps provided in a closed O-shape ferrite core. The core is cut to form two U-shaped disconnected halves to provide two operating gaps (hereinafter referred to as a quasi-closed ferrite core) between their disconnected ends. The gaps are fitted to side-openings of the bone-shaped ports, to let the alternating magnetic field of the core, disposed in a primary winding powered with RF, pass throughout the discharge chamber.

Each bone-shaped port provided in the discharge chamber walls (3 in FIGS. 2, 4) is shaped of two through side openings (4 in FIGS. 2, 4), corresponding to the disconnected ends of the quasi-closed ferrite core, and a through slot (5 in FIGS. 2, 4) connecting these openings. The alternating magnetic field B passing throughout the ferrite core gaps (operating gaps) within the discharge chamber induces in the operating gaps a vortex electric field E capable of accelerating the electrons, and consequently to excite and to maintain discharge plasma in an operating gas filling this chamber (see FIGS. 2, 3, 5, 6, 7). The actual electron current induced in the plasma by the vertex electrical field E forms closed loops of alternating current (virtual secondary winding) decreasing the value of the magnetic field B (having a minimum at a gap center plane in any regard) within gaps that improves the decompression of plasma electrons from the walls and provides in this way plasma wall insulation.

SUMMARY OF INVENTION

The present invention provides a well localized high purity plasma source comprising a quasi-closed ferrite core (1 in FIG. 2) disposed in coils (2 in FIG. 2) of a primary winding, a discharge chamber (3 in FIG. 2) equipped with opposed bone-shaped ports of a vacuum sealed high temperature insulator (quartz, silica, ceramic), and inserted in operating gaps of the quasi-closed ferrite to fit side-openings (4 in FIG. 2) of the bone-shaped ports with disconnected ends of the quasi-closed ferrite core. A vacuum sealed through slot (5 in FIG. 2) connecting the side openings (4 in FIG. 2) serves to prevent formation of short circuits around the side openings (4 in FIG. 2) admitting the alternating magnetic field B of the quasi-closed ferrite core into the discharge chamber. A flux of the alternating magnetic field B passing throughout the discharge chamber induces the alternating vertex electrical field E acting along loops enveloping the magnetic flux as is shown in FIG. 3, wherein the discharge chamber with its bone-shaped ports is not shown for clarity. The electrons accelerated in the electrical field E, igniting and maintaining discharge plasma in the operating gaps of the quasi-closed ferrite core, develop the actual alternating vertex electron currents forming a virtual secondary winding in the plasma. These alternating vertex currents decrease the value of the magnetic field B in the operating gaps and improve in this manner insured plasma wall thermoinsulation. The effect of the thermoinsulation is emphasized by a natural decrease of the electromagnetic energy density, and consequently electromagnetic field pressure toward the central plane of the gaps. Relatively high electron energy (20-50 eV) developed in the vertex electrical fields promotes plasma expansion by ambipolar diffusion in the preferred direction defined by an open space. In FIG. 3, the possible directions of plasma propagation along the main plane of the quasi-closed core symmetry are shown by fashioned arrows.

The small side openings of the bone-shaped ports do not face intense plasma because the voltage acquired by the electrons along loops less than the aperture of the openings (4 in FIGS. 2, 4) in this area is significantly less than the voltage acquired along wider loops surrounding a bulk part of the magnetic flux anywhere in the chamber, according to Faraday's Law. The through slot (5 in FIGS. 2, 4) connecting the side openings of the bone-shaped port is cut to prevent formation of a short circuit around the openings admitting the alternating magnetic field B into the chamber. To protect the insulator closing this slot from a direct interaction with dense plasma, this slot cross-section can be provided with a chevron or V shape. The insulator closing and vacuum-sealing the side openings and engaged with the slot of the bone-shaped port can be, for example, designed as a single rectangular solid plate (6 in FIG. 4) sealed by the O-ring (8 in FIG. 4) from the atmosphere side of the discharge chamber as is shown in FIG. 4. The sizes of the side openings $c_1$ and $d_1$ (see FIG. 4) of the bone-shaped port should be insignificantly more than the corresponding sizes c and d (see FIG. 3) of the quasi-closed core 1 aperture to permit a bulk portion of the magnetic flux provided at this location to pass. The preferred width g of the slot 5 (see FIG. 4) should not be decreased to a value less than 1-2 mm due to the fact that a further decrease can create a significant electric capacity between the closest opposite sides of the slot. This forms in this manner a capacitively shorted circuit for induced virtual alternating vertex currents, hampering in this case a penetration of the alternating magnetic flux into the chamber. The preferred cross section of the slot is chevron-shaped to prevent a direct plasma interaction with the portion of the insulator 6 (in FIG. 4) facing the plasma.

The source of plasma shown schematically in FIGS. 2 and 3 can be developed to a linear plasma source of any required length. For this purpose the quasi-closed ferrite cores with their primary windings should be mounted in parallel to one another in a column as it shown in FIG. 5. Indeed, in this column, components of the vectors E of the nearest units which are parallel to the core components are subtracted being in opposite directions, and the two neighboring electric field vertexes of the neighboring cores form one common vertex 7 for two (see FIG. 5) or more units, providing in this way formation of closed loops of an electron current of corresponding length. These closed loops of electron current form and maintain, in their turn along the column, uniform linear plasma expanding in the direction of any open space. See the fashioned arrows in FIG. 5. The uniformity of this linear plasma beam is defined by the distance h between units (see FIG. 5), and deviation of plasma density from its average value along the linear plasma beam produced by the same column can be easily made less than 1%.

The value of the operating gap a (see FIG. 3) formed between the ends of the disconnected spaced parts or ends of the quasi-closed ferrite core defines a value of the density of plasma induced in the gap: the more the distance a is the less is the density. Therefore the value a should be chosen from the requirements of the technology for which the plasma source is developed. However in cases wherein the distance a becomes more than the average distance b (see FIG. 3) between ends of the separated or spaced U-shaped parts of the quasi-closed ferrite core, a>h, the magnetic flux generated by the single U-shaped part of the ferrite core is closed from one of its cut ends to another one of the same parts as is shown in FIG. 6. The single U-shaped part of the quasi-closed ferrite (disposed in a primary winding powered with RF) being assembled with the discharge chamber by the bone-shaped port shown in FIG. 4, induces in the chamber the vertex electric field E with the profile shown schematically in FIG. 6 by closed loops. The electric field E accelerates plasma electrons forming further closed loops of the actual alternating electron current generating and maintaining plasma. The preferred direction of plasma propagation from this type of plasma source is shown in FIG. 6 by the fashioned arrows. Thus the properties of the single U-shaped part of the quasi-closed ferrite core are similar to the ones described for the conventional quasi-closed ferrite core with two actual flat operating gaps described above. In view of this fact, it is natural to consider the separated U-shaped part of the quasi-closed ferrite core as the single quasi-closed ferrite core with a wide operating gap. The character feature of the quasi-closed ferrite core with the wide operating gap is a formation of the single loop of the alternating electron current in plasma with a relatively lower (3-5 folds) density than the one generated by a conventional quasi-closed ferrite core. The quasi-closed ferrite units with the wide operating gaps can be also assembled in a column to obtain uniform closed electron loops 7 (see FIG. 7) of necessary length for generation and maintenance of a uniform linear plasma beam applicable for conveyor type technologies and for excitation of high power gas lasers (CO, CO2, Ar, Kr, etc.).

BRIEF DESCRIPTION OF THE DRAWINGS

Other objects and advantages appear hereinafter in the following description and claims. The accompanying drawings show, for the purpose of exemplification, without limiting the scope of the invention or the appended claims, certain practical embodiments of the present invention wherein:

DETAILED DESCRIPTION OF THE PREFERRED EMBODIMENT

Figure 1:
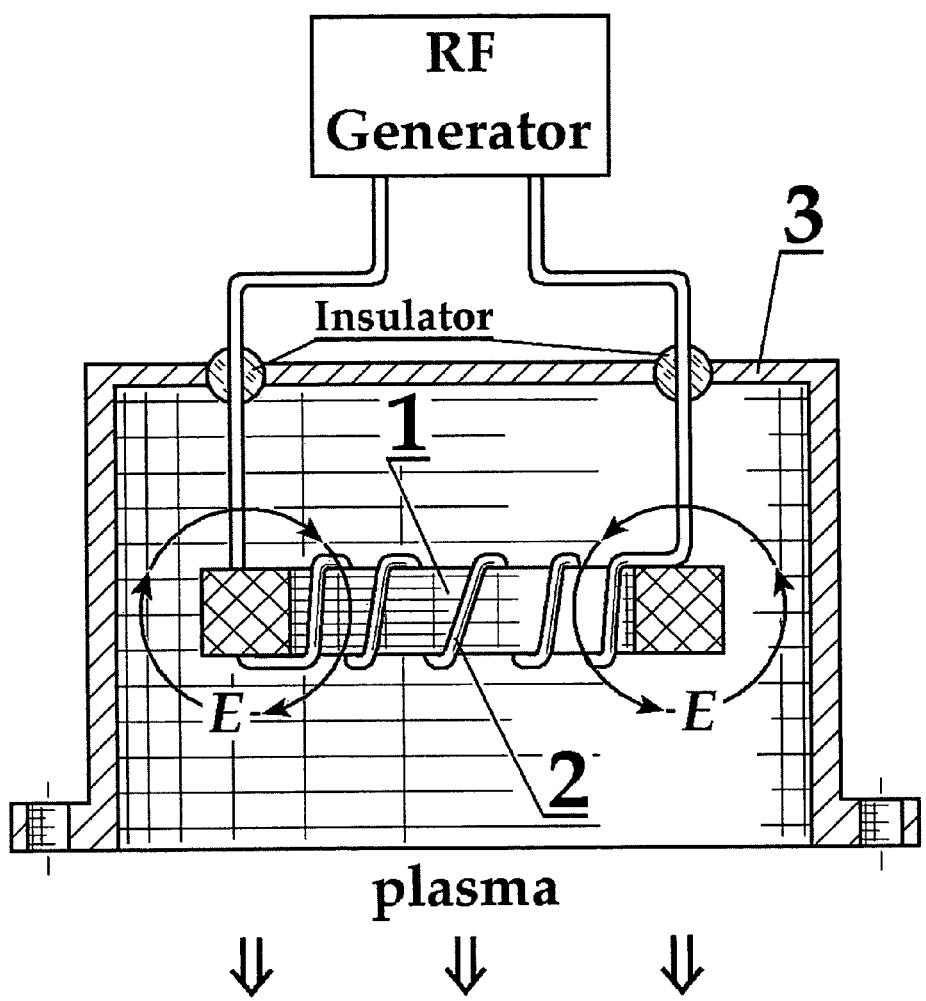
FIG. 1 is a schematic mid vertical sectional view of a known RF Plasma Inductor with a Closed Ferrite Core (capable of generating an alternating vertex electric field E for accelerating the electrons for excitation and maintenance of plasma) with the closed ferrite core 1 disposed in the coil 2 of a primary winding and positioned relative to plasma charged discharge chamber 3 to provide a virtual closed secondary winding formed around all the surfaces of the ferrite core in plasma [see U.S. Pat. No. 5,998,933 by E. Shun'ko].
Figure 2:
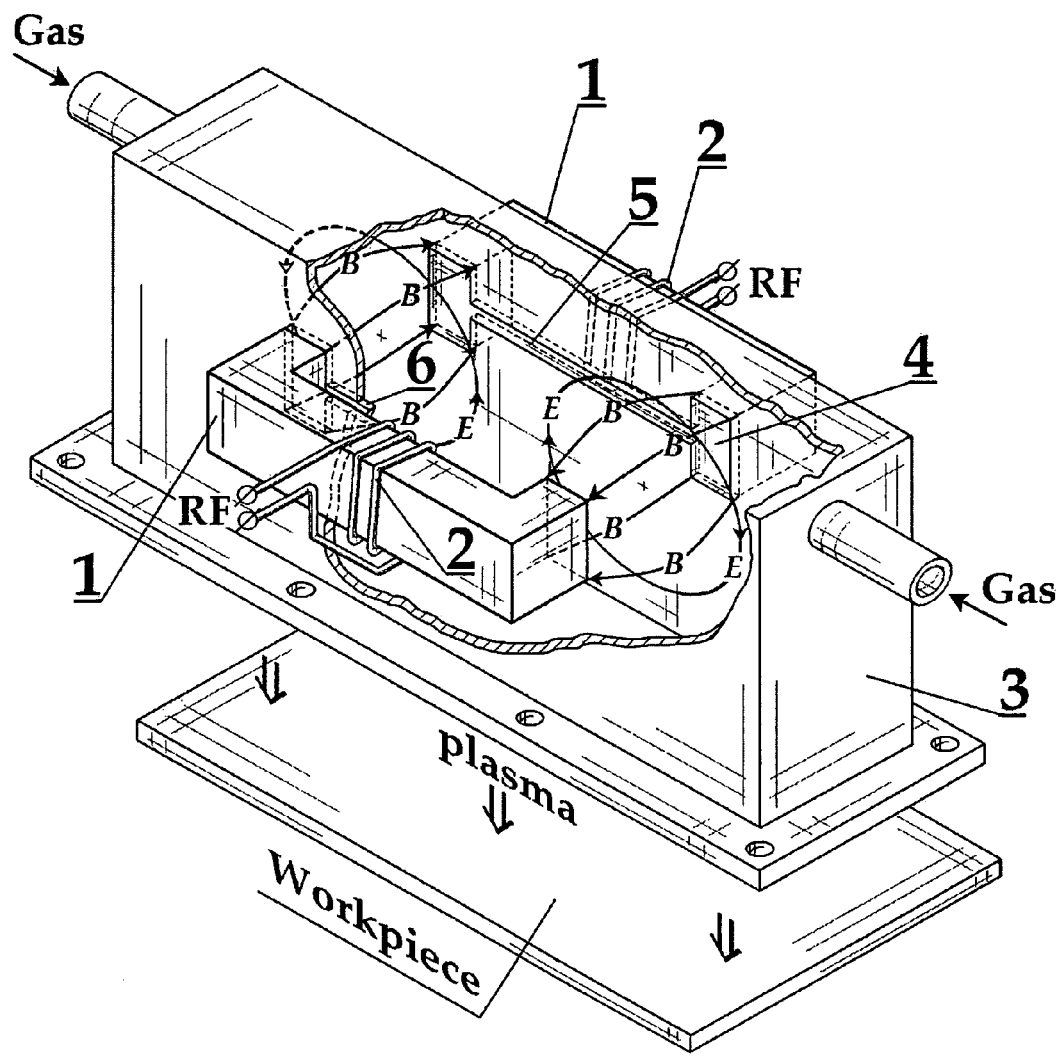
FIG. 2 is an isometric view in partial section to reveal internal portions of a plasma source with a quasi-closed ferrite core of the present invention.

The plasma source with a quasi-closed ferrite core made according to one embodiment of the present invention is shown in FIG. 2 by way of a three dimensional partial sectional view of the device. The device comprises a quasi-closed O-type ferrite core 1 of two symmetrically placed and disconnected or spaced U-shaped halves disposed in two coils 2 forming a primary winding connected to an RF generator, and a metallic (aluminum, copper) open sided box-type housing having a discharge chamber with two opposite closest walls equipped with opposed symmetrical bone-shaped ports comprised each of two trough side-openings 4 corresponding in dimension to the disconnected or spaced ends of quasi-closed ferrite core 1, and a through slot 5 connecting these openings. The bone-shaped ports are closed and vacuum-sealed by a high-temperature insulator 6 (quartz, ceramic, sapphire). The housing 3 is provided with two operating gaps formed between the disconnected ends of the quasi-closed ferrite core in its internal discharge chamber to fit the spaced ends of the core with these side openings of the bone-shaped ports. Cooling of the ferrite core 1 and the coils 2 is provided by natural heat-exchange with the surrounding air or with a flow of air forced by conventional fans (not shown in FIG. 2). Cooling of the chamber walls is provided by a conventional water cooling system, if necessary (also is not shown in FIG. 2). A gaseous working medium is supplied via two pipes connected symmetrically on the opposite end walls of the housing 3, see FIG. 2. Yield of operating plasma and gas evacuation are provided throughout the open side of the housing 3 equipped with a securing flange for this purpose, as is shown in FIG. 2. The device shown in FIG. 2 can be supplied with a standard power supply of 300-500 W, and 100-500 kH.

Figure 3:
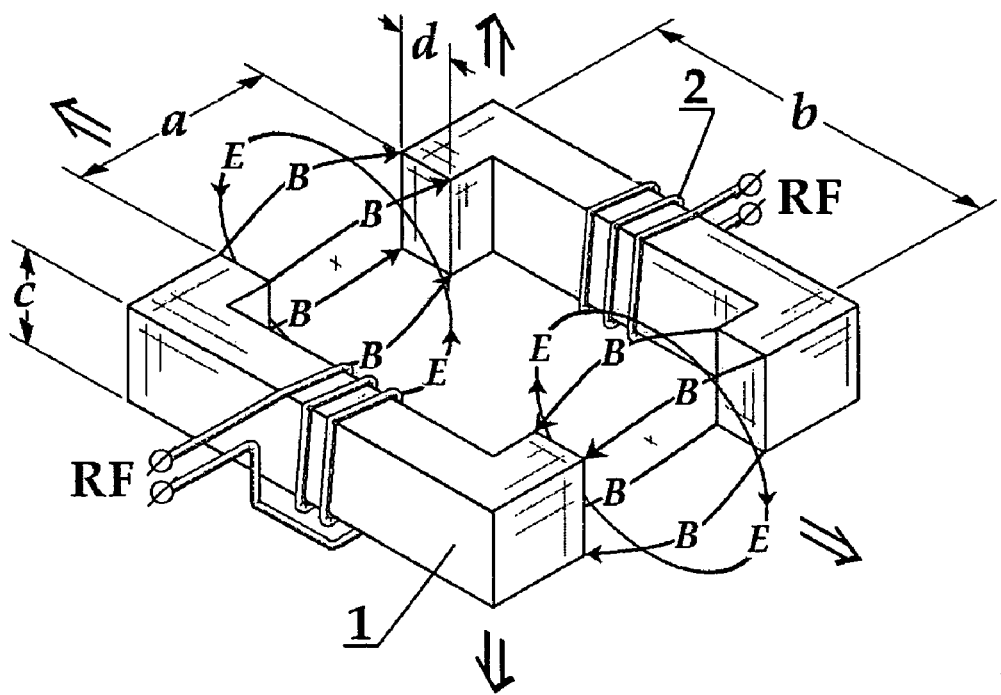
FIG. 3 is a schematic three-dimensional isometric view of the core unit of FIG. 2 formed of a single quasi-closed ferrite core disposed in primary winding coils, showing characteristic sizes of this ferrite and providing images of the magnetic and electric field vectors mapped within the assembly.

FIG. 3 is a three dimensional schematic view of the core portion of the present invention embodiment shown in FIG. 2 and presented as a unit formed of an O-type quasi-closed ferrite core 1 disposed in coils 2 of the primary winding connected to an RF power supply, to generate the magnetic field B with vectors crossing the operating gaps of width a formed between the disconnected or spaced ends of the quasi-closed ferrite core 1. The flux of the alternating magnetic field B induces in the operating gaps the alternating vertex electric field E, accelerating plasma electrons forming further loops of actual electron currents (virtual secondary winding) along the vector E directions, and exciting and maintaining plasma leaving the operating gaps in the directions lying in the plane of main symmetry of the device. These directions are shown by the fashioned arrows, and general physical sizes of quasi-closed ferrite core are presented in FIG. 3 for reference purposes. The discharge chamber housing 3 with bone-shaped ports admitting the alternating magnetic flux is not shown in this figure for clarity purposes.

Figure 4:
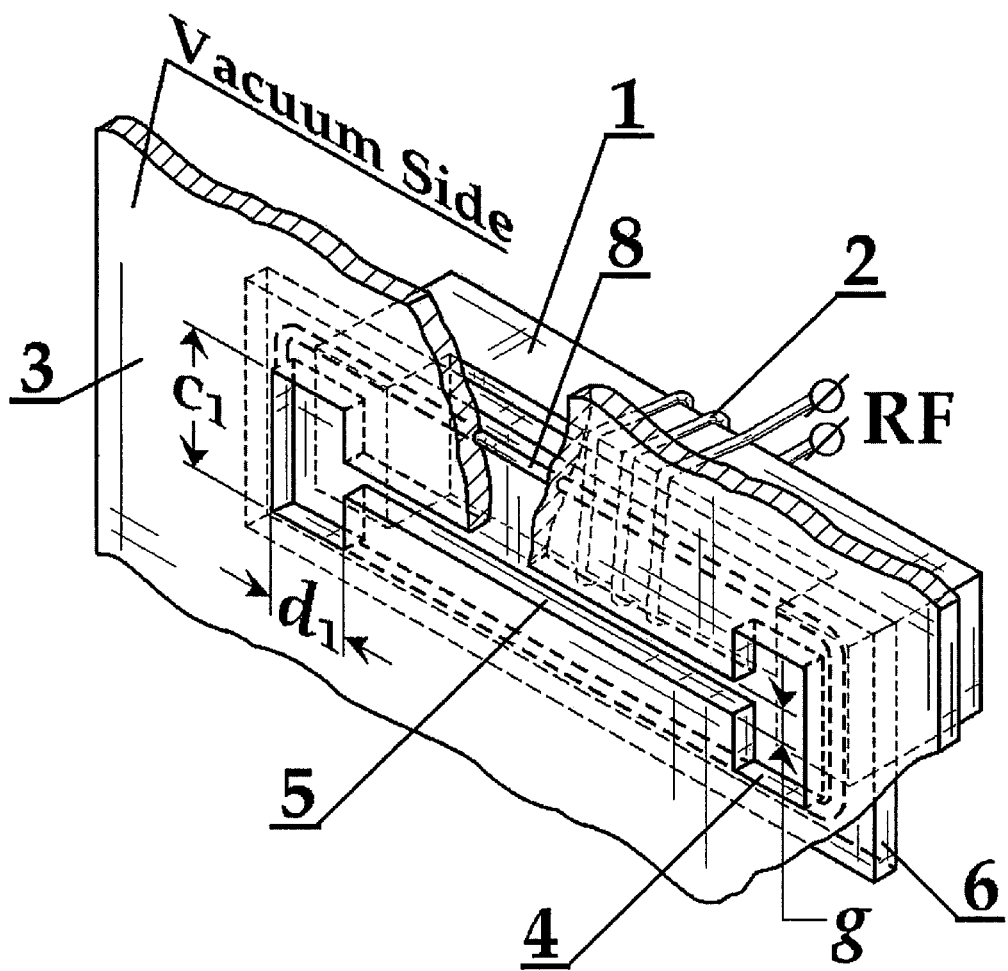
FIG. 4 is an enlarged isometric partial sectional view of a fragment of a discharge chamber wall of the structure of FIG. 2 equipped with a bone-shaped port closed with insulator material and assembled with a single U-shaped part of the quasi-closed ferrite core.

FIG. 4 is a three dimensional enlarged partial sectional detail view of a fragment of the discharge chamber housing wall equipped with the bone-shaped port comprising two through side openings 4 and a through slot 5 connecting these openings. This port is closed by the dielectric plate 6 and vacuum-sealed by the O-ring 8 from the atmosphere side of the wall. The U-shaped half of the quasi-closed ferrite core 1 disposed in the coil 2 is mounted to this dielectric plate 6 from its atmosphere side to fit the core ends with side-openings 4 of the bone-shaped port. The sizes $c_1$ and $d_1$ of the side-openings 4 should slightly exceed the corresponding sizes c and d of the aperture for the ends of the quasi-closed ferrite core to admit the bulk portion of the magnetic flux expanding spatially within the discharge chamber. The width g of the through slot 5 is about 1.5-2 mm, and a preferable slot cross section is a chevron shape or V groove (not shown in FIG. 4) to protect the insulator plate 6 from direct interaction with plasma components.

Figure 5:
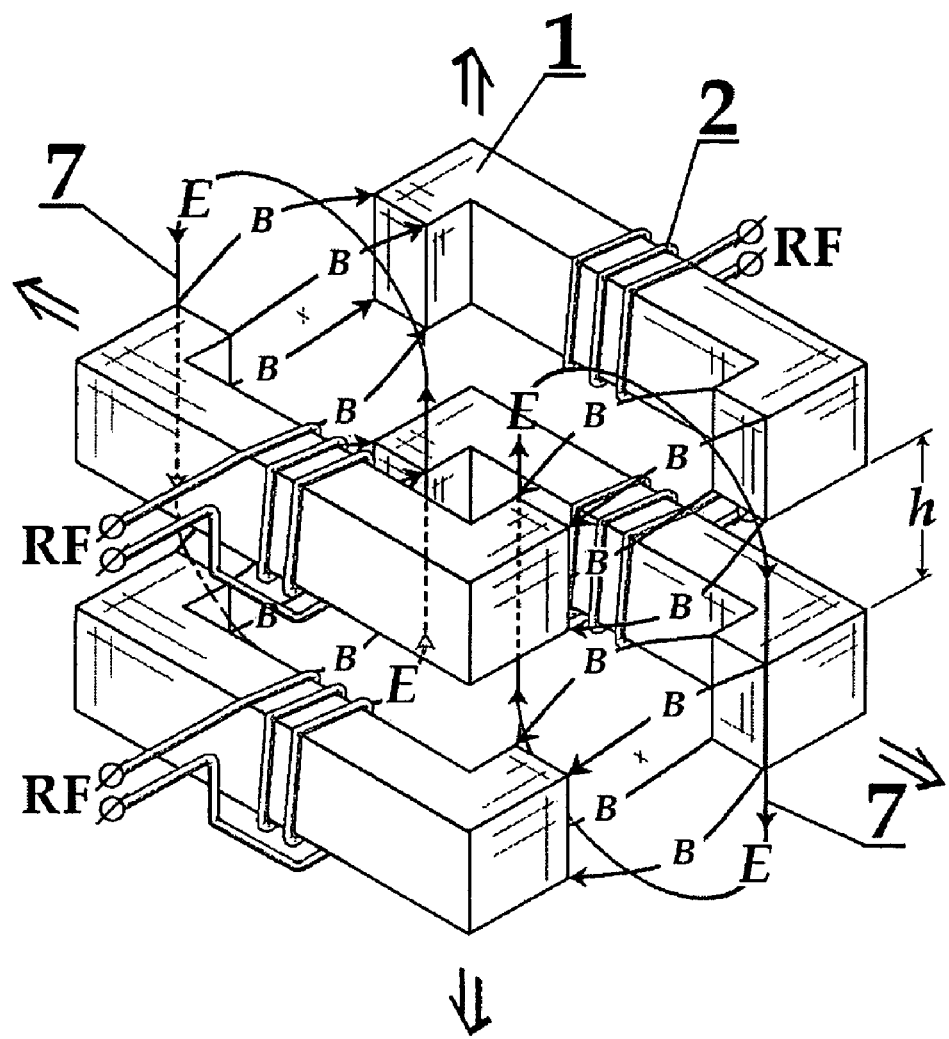
FIG. 5 is a schematic three-dimensional isometric view of a column of two quasi-closed ferrite cores of the present invention disposed in primary windings to induce combined loops of a vertex electrical field.

FIG. 5 is a three dimensional view of a main portion of one of the present invention embodiments developed from the embodiment shown in FIGS. 2 and 3 by arrangement of two operating units of quasi-closed cores placed in parallel to one another in a column. In this configuration, the vector E components parallel to the core plane of the nearest units are subtracted being oppositely directed, and the two neighboring electric field vertexes form one common vertex 7 in place of two, as is shown in FIG. 5, or more units providing in this way formation of closed loops of the electron current of corresponding length. These closed electron current loops maintain in their turn formation of uniform linear plasma along the column of a required length flowing in the direction of any open space. Preferable directions of plasma propagation are shown in FIG. 5 by fashioned arrows.

Figure 6:
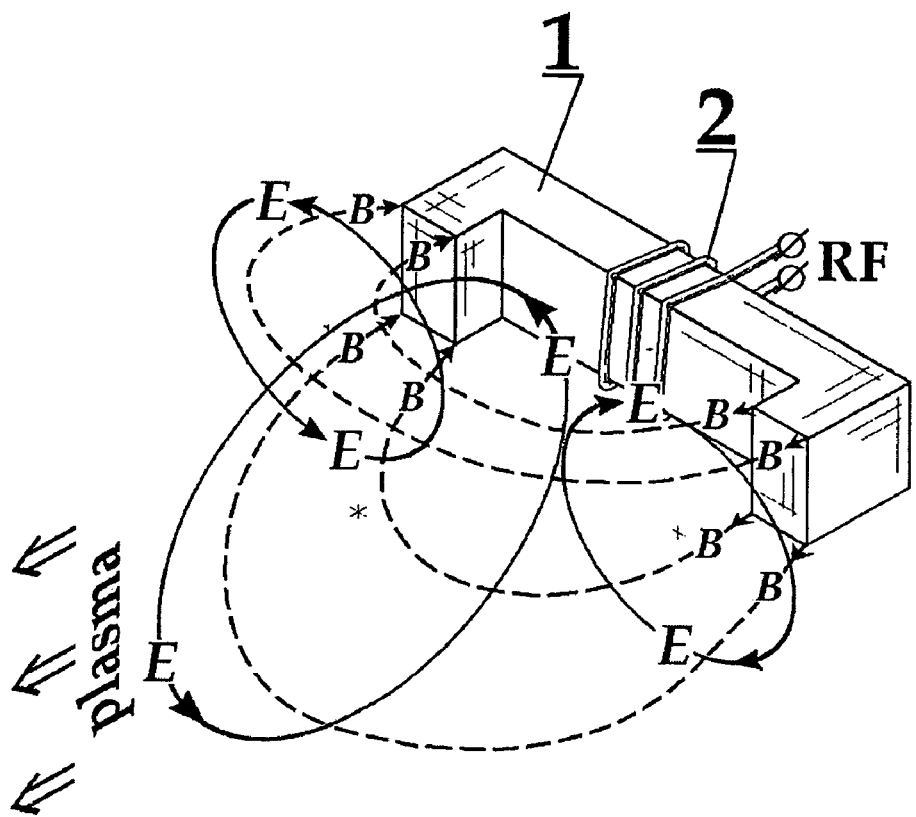
FIG. 6 is a schematic three-dimensional isometric view of a quasi-closed ferrite core of the present invention having a wide operating gap and disposed in a coil of a primary winding to generate magnetic and vertex electric alternating fields developed in the operating gap and forming the corresponding vectors mapped in this figure.

FIG. 6 is a three dimensional view of a main portion of one of the present invention embodiments developed from the embodiments shown in FIGS. 2 and 3 by cutting the core in half along its main plane of symmetry. Only one of the U-shaped halves of the quasi-closed ferrite core 1, disposed in a coil 2 of the primary winding connected to an RF generator, is shown in this figure with alternating magnetic field vectors B originating from one open end of the U-shape ferrite core and ending on another one. The vectors of the alternating vertex electric field E induced by the alternating magnetic flux are mapped in this figure as well. Plasma electrons accelerated in this electric field E excite and maintain the discharge of plasma acquiring a preferable direction of propagation outward from the U-shaped core. The operating unit shown in FIG. 6 should be mounted on a metallic wall or flange equipped with the bone-shaped port closed and vacuum-sealed with insulator material as is shown for example in FIG. 4. It is understood that a maximum density of magnetic flux and consequently the value of the electrical field induced by the U-shaped quasi-closed ferrite core with a wide operating gap shown in FIG. 6 is less than the ones developed by the conventional quasi-closed ferrite core with two narrower operating gaps shown in FIGS. 2 and 3. Consequently a density of plasma generated by the unit of this embodiment is expected to be less as well.

Figure 7:
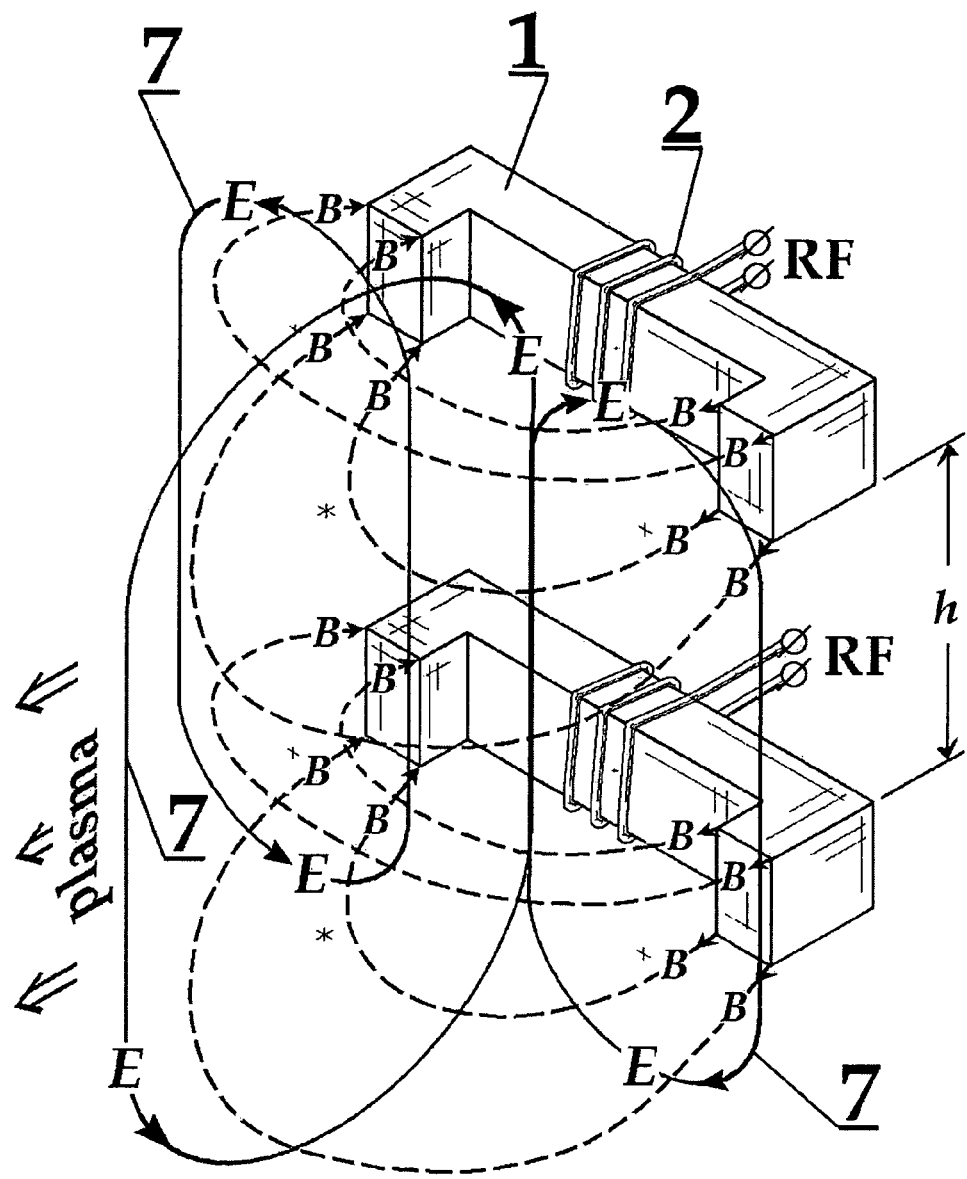
FIG. 7 is schematic three-dimensional isometric view of a column assembled of two quasi-closed ferrite cores having wide operating gaps and disposed in coils of primary windings to induce combined loops of an alternating vertex electrical field exciting and maintaining a single linear plasma beam in accordance with the teachings of the present invention.

FIG. 7 is a three dimensional view of a main portion of one of the present invention embodiments developed from the embodiment shown in FIG. 6 by arrangement of two operating units of U-shaped quasi-closed ferrite cores parallel to one another in a column. In this configuration, the vector E components parallel to the core plane of the nearest units are subtracted, being directed oppositely, and two neighboring electric field vertexes induced by neighboring units form one common vertex 7 for two, as it is shown in FIG. 7, or more units arranged in a single column providing in this way formation of closed loops of the electron current of corresponding length. This closed electron current loop maintains in its turn formation of extremely uniform linear plasma along the column of a required length (defined by quantity of the units arranged in column) to perform industrial conveyor-type treatment of large surface areas and to provide a gas medium excitation for high power gas lasers. Preferable direction of plasma propagation for this column-type source is shown in FIG. 5 by fashioned arrows.

I claim:
1. An inductively coupling plasma source comprising:
a primary winding powered directly from a radio frequency source;
a quasi-closed O-type ferrite core comprised of two equal U-shaped core halves separated from one another to form two operating gaps between aligned spaced ends of said core halves, said quasi-closed ferrite core disposed in said primary winding;
a metallic housing having a discharge chamber therein and two opposed walls having symmetrically opposed bone-shaped ports, said ports closed and vacuum sealed with insulating material and each comprising two through side openings dimensionally respectively fitted to and engaged with said spaced ends of said quasi-closed ferrite core and a through slot connecting said side openings along their centerline for inductive excitation and maintenance of plasma in said operating gaps positioned within said discharge chamber.

2. An inductively coupled plasma source as recited in claim 1, wherein only a single one of said U-shape halves of said quasi-closed ferrite core is provided and fitted to a corresponding single one of said bone-shaped ports, the other said bone-shaped ports being omitted;
a single wide operating gap being formed between said ends of said single U-shaped half of said quasi-closed ferrite core for inductive excitation and maintenance of plasma in said single wide operating gap positioned in this manner within said discharge chamber.

3. An inductively coupled plasma source as recited in claim 2, including a plurality of said single quasi-closed ferrite cores disposed respectively in a plurality of said primary windings, and assembled in parallel to one another in a column for providing a linear distribution of high uniformity plasma along said column.

4. An inductively coupled plasma source as recited in claim 2, including a plurality of said single quasi-closed ferrite cores with said wide single operating gaps being disposed respectively in a plurality of said primary windings to arrange a two dimensional assembly for providing a uniform distribution of plasma about a required area.

5. An inductively coupled plasma source as recited in claim 1, including a plurality of said quasi-closed ferrite cores disposed respectively in a plurality of said primary windings, and assembled in parallel to one another in a column for providing a linear distribution of high uniformity plasma along said column.

* * * * *